United States Patent [19]

Yoshida et al.

[11] Patent Number: 5,450,566
[45] Date of Patent: Sep. 12, 1995

[54] REGISTER BLOCK CIRCUIT FOR CENTRAL PROCESSING UNIT OF MICROCOMPUTER

[75] Inventors: Kazuyoshi Yoshida, Tokyo; Hiroshi Itoh; Hiroshi Fukuoka, both of Yokohama; Makoto Shinohara, Kawasaki, all of Japan

[73] Assignee: Kabushiki Kaisha Toshiba, Kawasaki, Japan

[21] Appl. No.: 52,287

[22] Filed: Apr. 26, 1993

Related U.S. Application Data

[63] Continuation of Ser. No. 461,004, Jan. 4, 1990, abandoned.

[30] Foreign Application Priority Data

Jan. 13, 1989 [JP] Japan ................................. 1-7432

[51] Int. Cl.[6] ........................................... G06F 12/06
[52] U.S. Cl. ..................... 395/477; 364/247.8; 364/965.9; 364/DIG. 1
[58] Field of Search ... 364/200 MS File, 900 MS File; 395/400 MS, 425 MS

[56] References Cited

U.S. PATENT DOCUMENTS

| | | | |
|---|---|---|---|
| 3,748,451 | 7/1973 | Ingwersen | 364/728.01 |
| 4,598,362 | 7/1986 | Kinjo et al. | 364/200 |
| 4,628,489 | 12/1986 | Ong et al. | 365/230.04 |
| 4,680,730 | 7/1987 | Omoda et al. | 364/900 |
| 4,727,474 | 2/1988 | Batcher | 364/200 |
| 4,805,133 | 2/1989 | Greenfield | 395/325 |
| 4,866,603 | 9/1989 | Chiba | 395/425 |
| 4,888,772 | 12/1989 | Tanigawa | 371/21.2 |
| 4,901,230 | 2/1990 | Chen et al. | 395/325 |
| 4,908,748 | 3/1990 | Pathak et al. | 395/400 |
| 4,914,577 | 4/1990 | Stewart et al. | 395/400 |
| 4,926,323 | 5/1990 | Baror et al. | 364/200 |
| 4,953,131 | 8/1990 | Purdham et al. | 365/222 |
| 5,008,852 | 4/1991 | Mizoguchi | 364/900 |
| 5,043,878 | 8/1991 | Ooi | 364/200 |
| 5,099,485 | 3/1992 | Bruckert et al. | 371/68.3 |
| 5,307,502 | 4/1994 | Watanabe et al. | 395/800 |

FOREIGN PATENT DOCUMENTS 0130793  9/1985  European Pat. Off. .
0182353  5/1986  European Pat. Off. .
0269106  1/1988  European Pat. Off. .

*Primary Examiner*—Reba I. Elmore
*Attorney, Agent, or Firm*—Oblon, Spivak, McClelland, Maier & Neustadt

[57] ABSTRACT

A semiconductor device including a register bank circuit including a register array for storing data. The register array has a matrix structure formed by a plurality of banks arranged in a row and a plurality of registers arranged in a column. Each bank is a group of a predetermined number of registers. A bank selector selects one of the banks, and a register selector selects a register corresponding to the bank selected by the bank selector. The selected register is coupled to a bus.

7 Claims, 18 Drawing Sheets

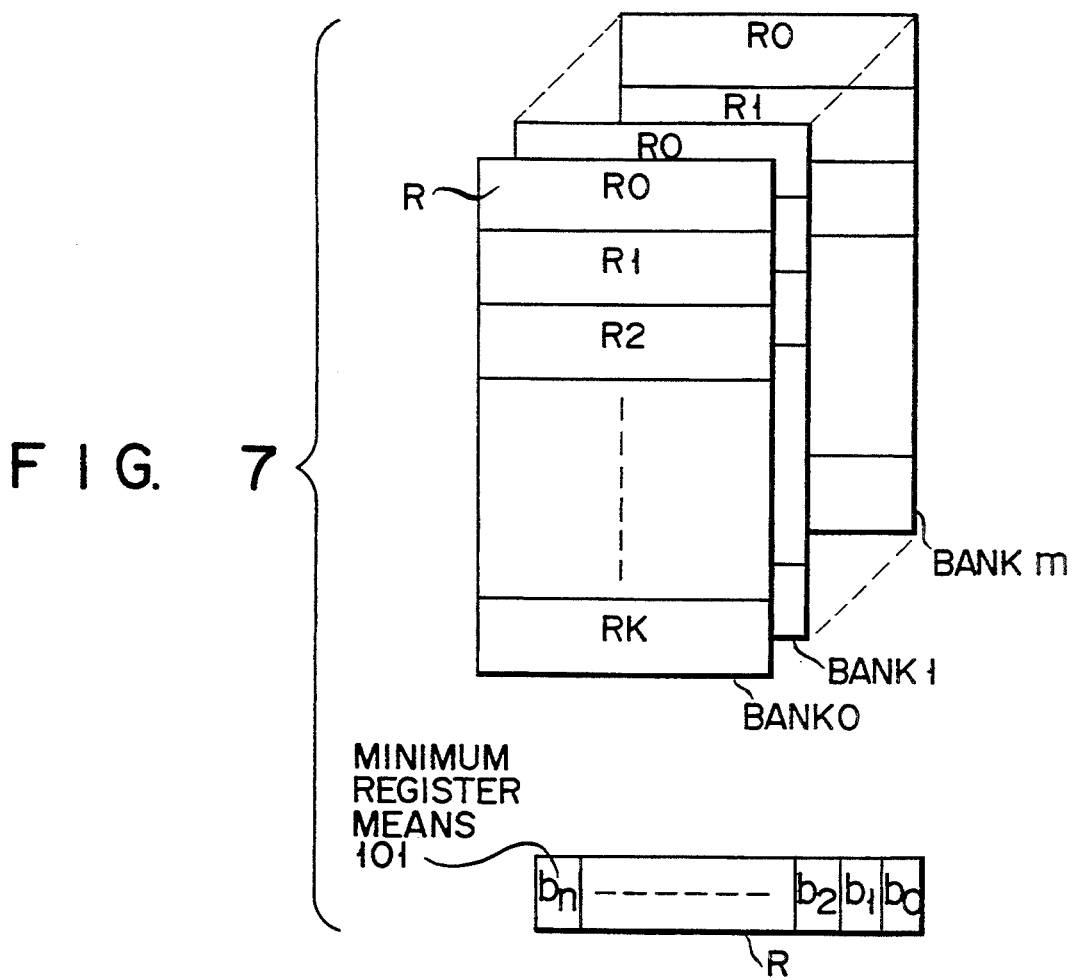
F I G. 7

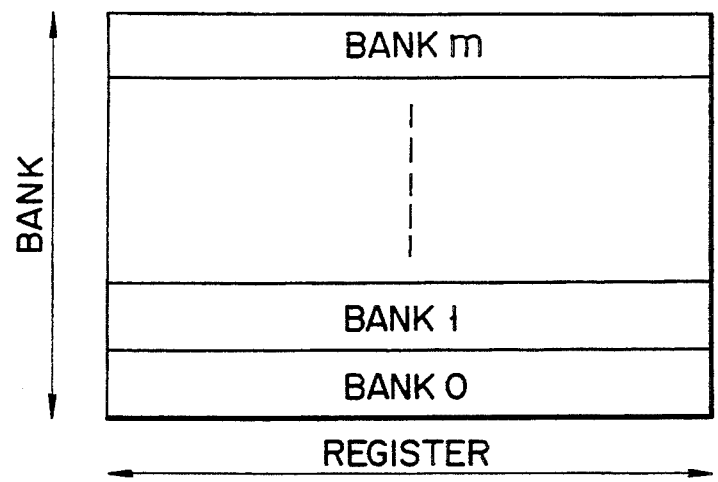
F I G. 8
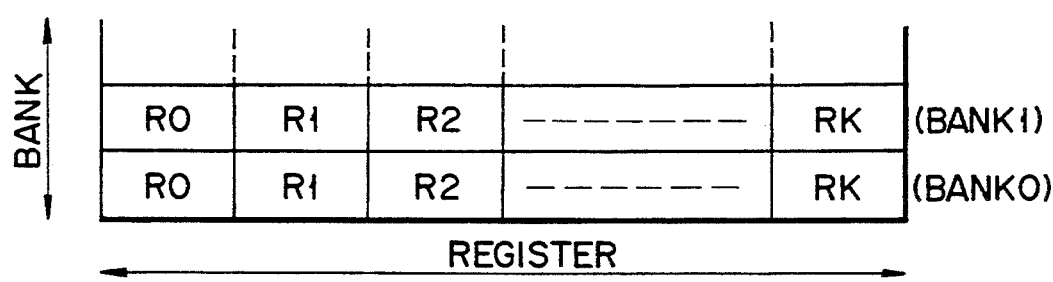
F I G. 9
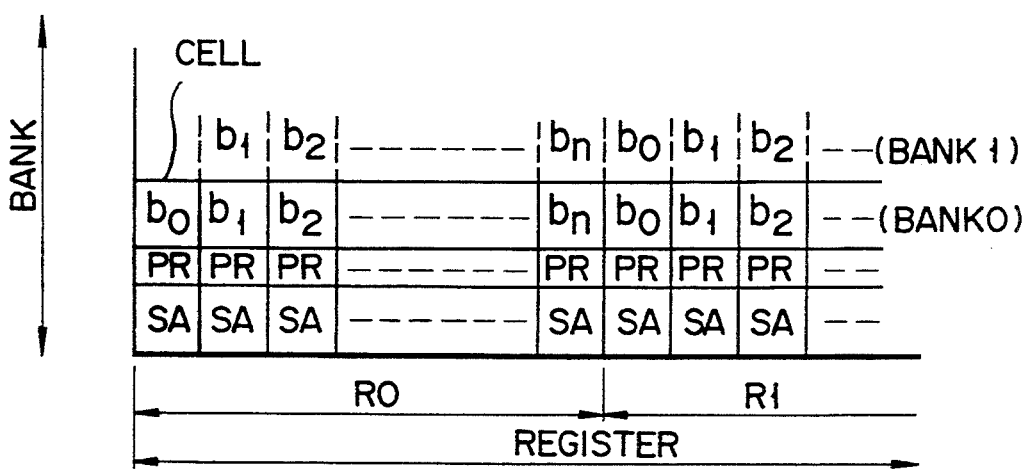
F I G. 10

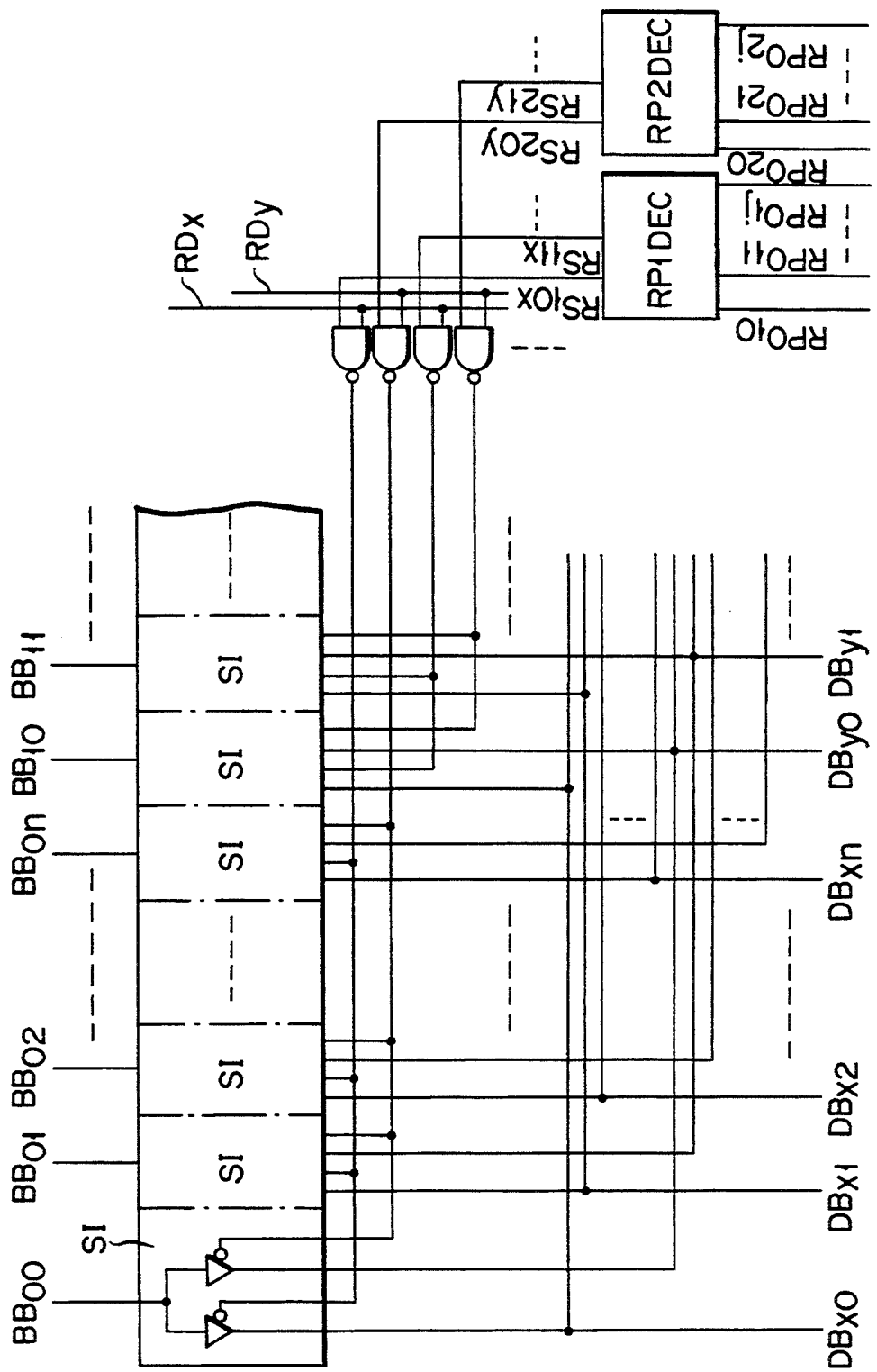
F I G. 14

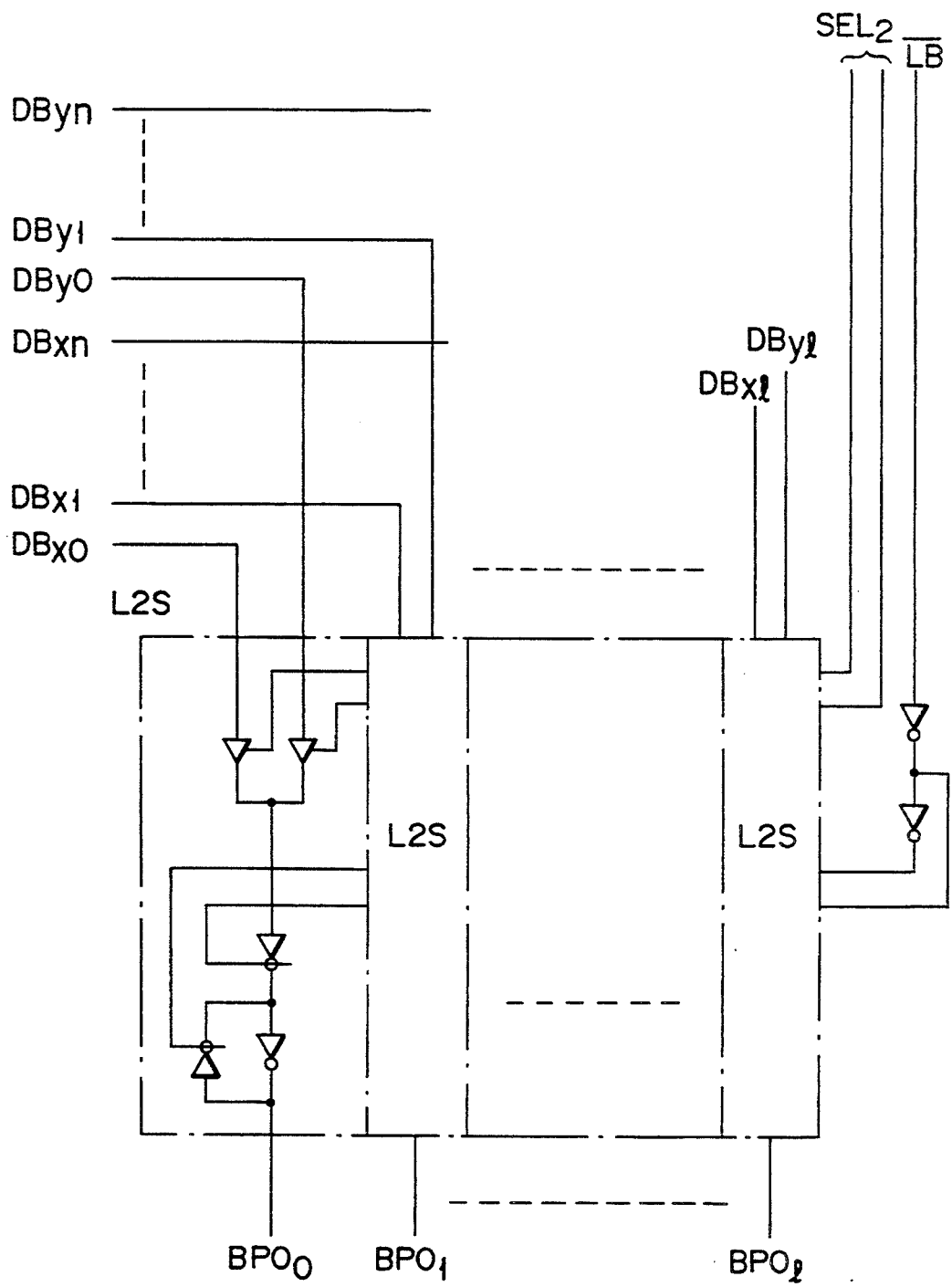
F I G. 16

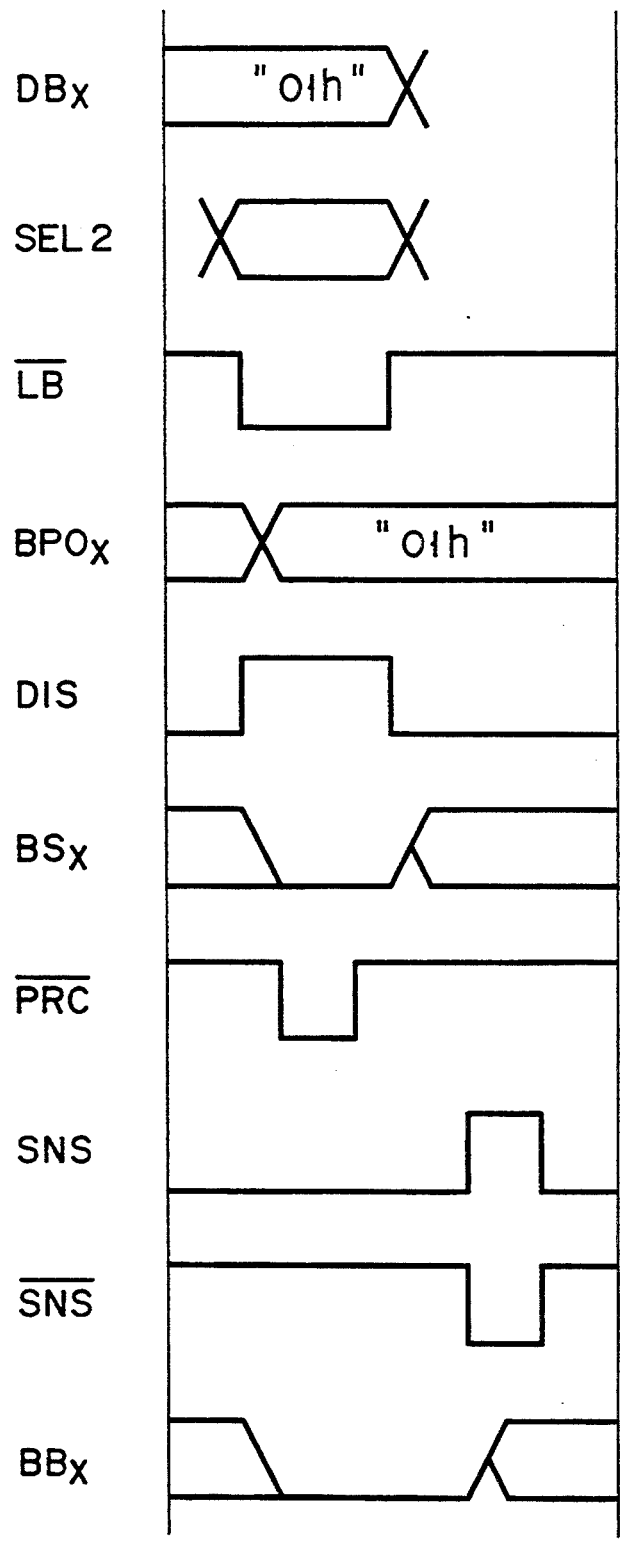
F I G. 18

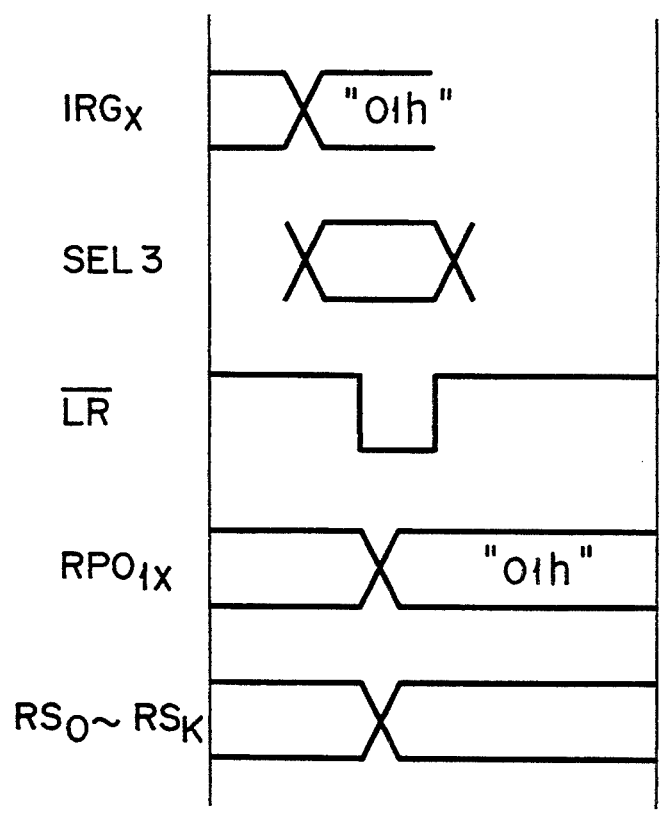
F I G. 19

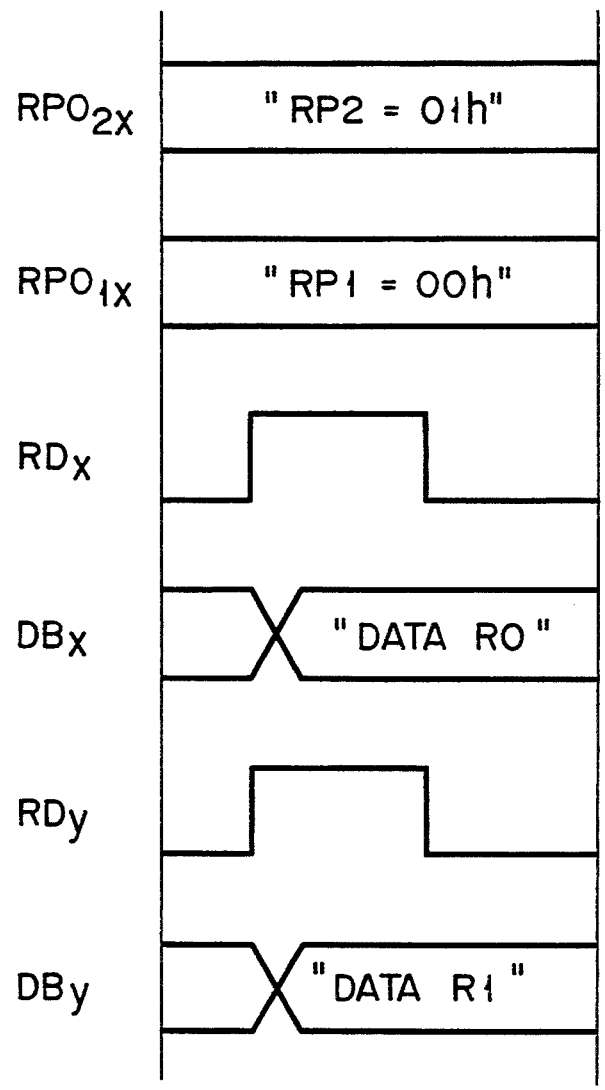
F I G. 20

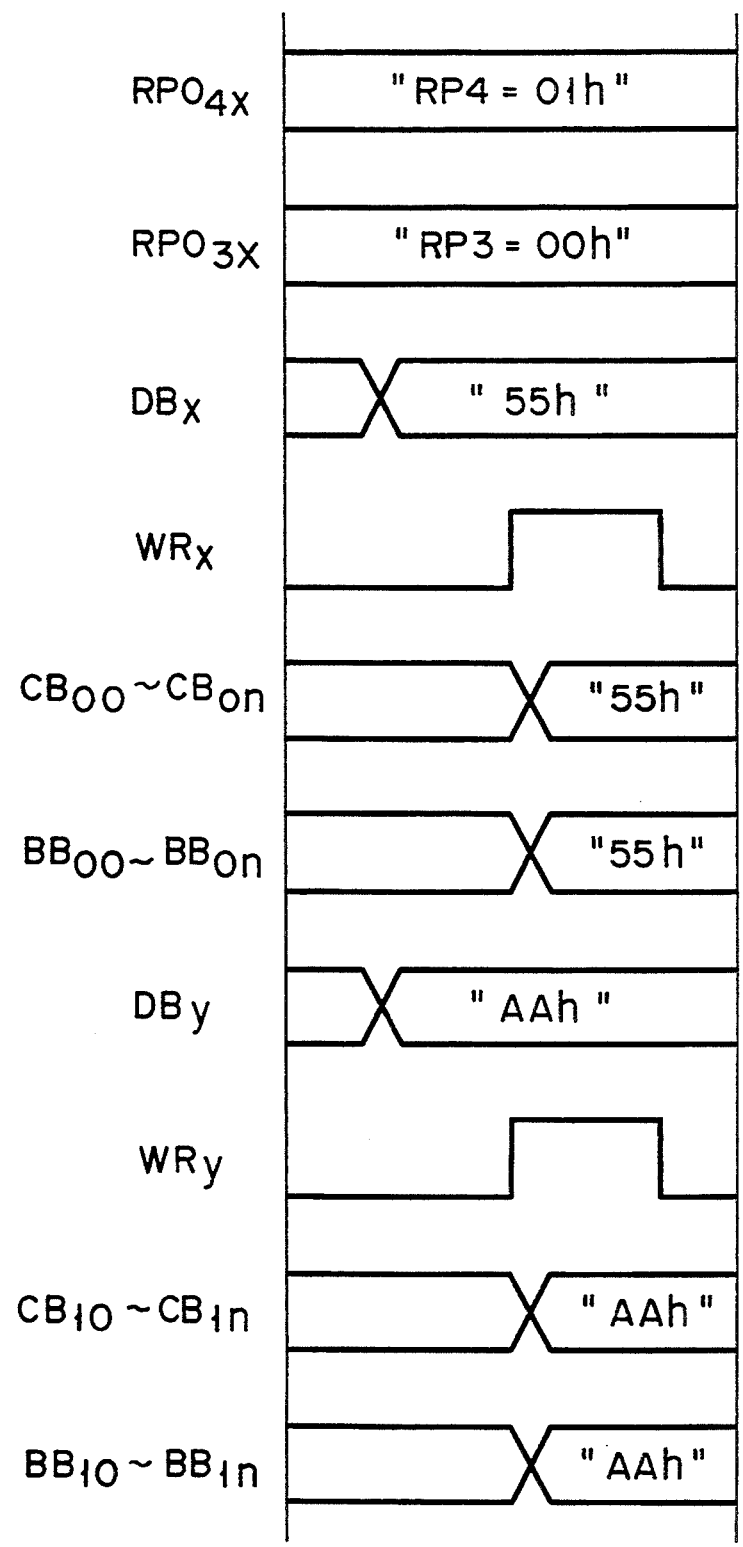
F I G. 21

REGISTER BLOCK CIRCUIT FOR CENTRAL PROCESSING UNIT OF MICROCOMPUTER

This application is a continuation of application Ser. No. 07/461,004, filed on Jan. 4, 1990, now abandoned.

BACKGROUND OF THE INVENTION

1. Field of the Invention

This invention relates to a register bank circuit of for example, an operation processing device, and more particularly to a register bank circuit used in a microprocessor.

2. Description of the Related Art

As shown in FIG. 3, the register bank circuit includes a RAM (read/write memory) 21, a register pointer 22 for storing a register number, a bank pointer 23 for storing a bank number and an address generating circuit 24 for creating an address according to outputs of the bank pointer and register pointer. The register bank circuit uses the register bank system in which the address created in the address generating circuit 24 is supplied to the RAM 21 to permit the read or write operation with respect to a desired register.

However, the above register bank circuit has the following defects.

(a) Since the RAM 21 is used as a register, a period of time (access time) from when the address is supplied until data on a data bus 25 becomes effective is long. Therefore, when the register bank system is used in a microprocessor or the similar computer circuit, each time the read/write operation is performed, an access time delay is experienced. As a result, the processing speed of the microprocessor is limited, making it difficult to introduce the register bank system into a processor which requires high processing speed.

(b) Since a RAM is used as a register, it is impossible to simultaneously access data stored in two different storage locations in the RAM. Therefore, if the register bank circuit is used in a microprocessor and when data of two registers is required to be processed, the processing speed becomes low in comparison with that of a system in which two registers can be simultaneously accessed since the two registers must be accessed one at a time.

A register bank system as shown in FIG. 4 is proposed so as to eliminate the defects of the register bank circuit of FIG. 3.

The above system includes a plurality of register latch groups 31 respectively constituting banks, register pointers 32-1 and 32-2 for storing register numbers, a bank pointer 33 for storing a bank number and a decoder 34 for decoding outputs of the register pointers and the bank pointer. In this system, a maximum of two registers can be selected from a desired one of the banks among the plurality of register latch groups 31 in response to the output of the decoder. In this case, the number of register latch groups 31 correspond to the number of bank numbers.

Assume now that each bank is constituted by a register bank of 8-register construction which includes eight registers. FIGS. 5 and 6 show the detailed construction thereof. As shown in FIGS. 5 and 6, each register latch group 31 includes eight register latches $R_0$ to $R_7$. The output of the decoder 34 is constructed by 8 bank select signal sets (BS7 to BS0) and each bank select signal set is provided in one-to-one correspondence with the bank number and is connected to a corresponding one of the register latch groups 31. Further, since each register is selected by means of the register pointers 32-1 and 32-2, each bank select signal set is divided into two signal line groups (for example, BS7$a$ and BS7$b$). Each signal line group includes eight control signal lines. The control signal lines are provided in one-to-one correspondence with the register numbers and respectively connected to the register latches $R_0$ to $R_7$. With this construction, one of the register latches $R_0$ to $R_7$ can be independently selected from each signal line group. The register latch selected by the first signal line group permits data to be subjected to the read/write operation via the data bus 35-1 and the register latch selected by the second signal line group permits data to be subjected to the read/write operation via the data bus 35-2.

A microprocessor having the above register bank circuit introduced therein can effect high-speed register transfer and the operation speed thereof can be enhanced.

However, the microprocessor has the following defects when compared with that having the register bank circuit as shown in FIG. 3.

(a) Since the register is constructed by the register latch, the circuit scale becomes large in comparison with the system using the RAM of FIG. 3. For example, in a case where a circuit as shown in FIG. 5 is formed in an integrated configuration, an occupancy area which is more than twice the occupancy area required when the system using the RAM is utilized must be provided, and it becomes impossible to form a desired number of registers.

(b) The number of control lines (the bank select signal lines and the register select signal lines) of the decoder 34 is large. Therefore, when it is formed in an integrated configuration, it requires a large area for the wiring in comparison with that required in the system using the RAM and the handling thereof becomes troublesome.

(c) When the bank number is changed, it is necessary to redesign the decoder section. Since the scale of the decoder of this system is large, it is necessary to change the circuit on a large scale. This is a severe limitation when it is formed in an integrated configuration.

SUMMARY OF THE INVENTION

An object of this invention is to provide a register bank circuit for use in a microprocessor or the like, which is simple and compact in construction and capable of high speed processing and in which a large number of registers and banks is possible.

A register bank circuit of this invention as shown in FIGS. 1A and 1B includes register array means (51) for storing data, said register array means having a matrix structure which is formed of a plurality of banks (BJ) arranged in a row of the matrix structure and a plurality of registers (RK) arranged in a column thereof; first selector means (53, 54) for selecting a specified one (e.g., B1) of said banks (BJ); second selector means (55, 56) for selecting one (e.g., R2) of said registers (RK) in the specified one bank (B1), so that the selected register (R2) is coupled to a bus (57).

With the above construction, the register bank of this invention can specify a desired one of the plurality of registers by selectively specifying the register number and the bank number.

Therefore, in a case where an ordinary RAM is used as a register, the time for specifying a register can be shortened in comparison with the case where a register is specified by changing the register and bank numbers according to the address.

Further, unlike the structure in which the register pointers are directly connected to the banks, the occupied area will not be large and a relatively large number of registers can be formed in a small area.

The bank and register numbers supplied from the controller are stored for a preset period of time by the first selector means (53, 54) and the second selector means (55, 56). Therefore, when the same bank number is continuously specified so as to process data between the registers in the same bank, for example, the time for accessing each register can be shortened. That is, if the bank number is only once specified, then the bank number can be stored by the means (53) for storing the bank number so that it is not necessary to change the bank number if the bank number is continuously specified. As a result, the microprocessor using the register of this invention can attain a high-speed data processing.

BRIEF DESCRIPTION OF THE DRAWINGS

FIG. 7 is a conceptional diagram showing the construction of a register;

FIG. 8 is a conceptional diagram showing the construction of a register bank array;

FIG. 9 is a conceptional diagram showing the construction of a register array;

FIG. 10 is a conceptional diagram showing the construction a bit array;

FIG. 14 is a circuit diagram showing one embodiment of a read selector RSEL;

FIG. 16 is a circuit diagram showing one embodiment of a bank pointer BP;

FIG. 18 is a timing chart showing one embodiment of timings at which the register banks are changed;

FIG. 19 is a timing chart showing one embodiment of update timings of the register pointer RP1;

FIG. 20 is a timing chart showing one embodiment of timings at which data is read out from the register; and FIG. 21 is a timing chart showing timing at which data "55" on DBx and data "AA" on DBy are simultaneously written into R0 and R1.

DETAILED DESCRIPTION OF THE PREFERRED EMBODIMENTS

Figure 1A:
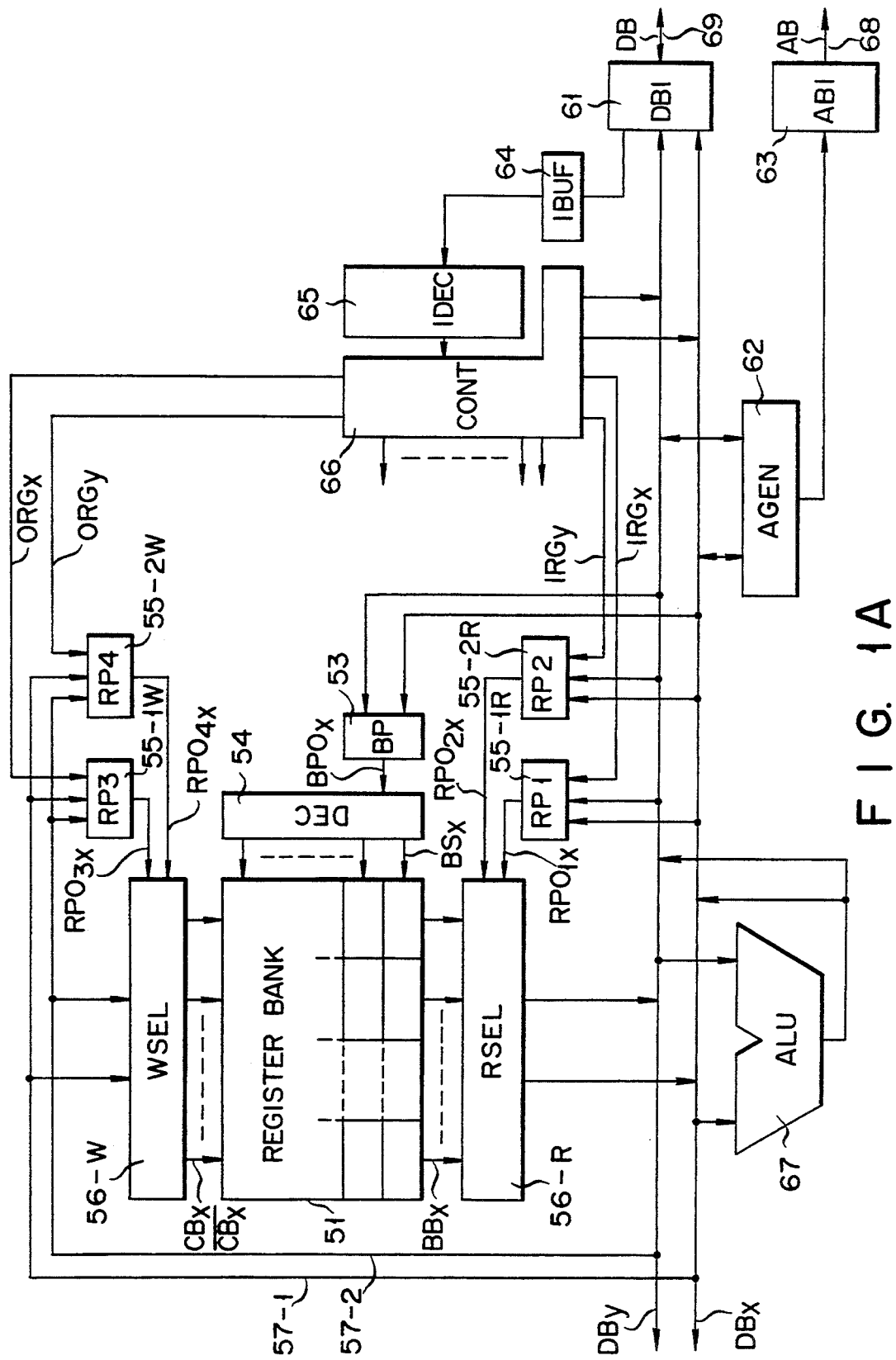
FIGS. 1A and 1B are diagrams showing the schematic construction of an embodiment of this invention.

FIG. 1A is a diagram showing the schematic construction of one embodiment of this invention and corresponding to a block diagram of the main portions of a microprocessor having functions as next described.

DBI 61 is a data bus interface and permits instruction or data transfer between a program memory and data memory via a data bus DB 69. Address information required at this time is created in an address generating unit AGEN 62 and is supplied via an address bus interface ABI 63 and an address bus AB 68. Instructions read from the memory are held in the instruction buffer IBUF 64 and sequentially supplied to an instruction decoder IDEC 65 and decoded therein. A control signal generation unit CONT 66 generates control signals necessary for executing the decoded instructions. An ALU 67 is an arithmetic logic operation unit and effects various operations such as arithmetic operations and logic operations. A REGISTER BANK 51, in FIG. 1A, is an array of registers arranged in a bank configuration and utilized by a programmer. Each register banks is designated by a respective number by which it is selected. The selected register bank has its bank number stored by a bank pointer BP 53 and the content of the bank pointer is decoded by a decoder DEC 54 which in turn outputs a selection signal for the register bank. The register number for read operation in the selected register bank is stored by register pointers RP1 55-1R and RP2 55-2R. An RSEL 56-R is used as a selector block for selecting a register specified by the register pointers and outputting the content thereof. The register number for write operation in the selected register bank is stored by register pointers RP3 55-1W and RP4 55-2W. A WSEL 56-W is used as a selector block for selecting a register specified by the register pointers and writing data into the selected register.

The function blocks are coupled to one another by means of data buses DBx and DBy to permit data transfer. Outputs IRGx, IRGy, ORGx and ORGy of a CONT unit 66 are signal lines for transferring the register number specified by the instruction to the respective register pointers. RPO1x, RPO2x, RPO3x and RPO4x are output signal lines connected between the register pointers 55-R, 55-2R, 55-1W and 55-2W and the selector units 56-R and 56-W. BPOx are output signal lines of a bank pointer 53 and BSx are selection signals of a register bank 51. CBx and an inverted signal $\overline{CBx}$ thereof are bit bus signals of each register. BBx is a reading data signal line of the bit of each register.

Figure 1B:
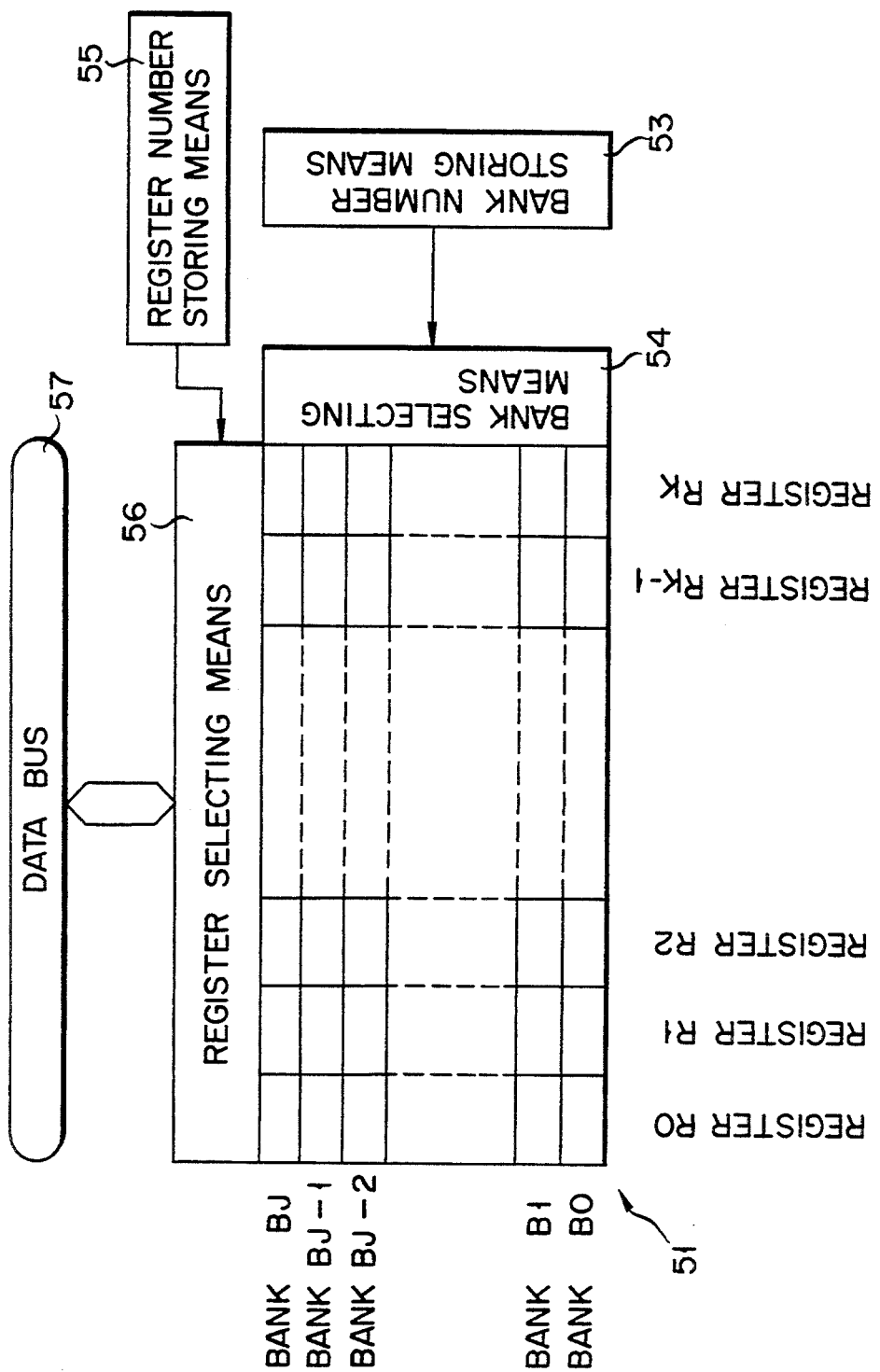

With reference to FIGS. 1A and 1B, there is explained a case wherein an instruction of "add the contents of the registers R0 and R1 together and set the sum into the register R2" is executed.

First, assume that a register bank number is previously set in the bank pointer 53. The instruction is taken out from the IBUF 64 and decoded by the IDEC unit 65 and various control signals are generated. At this time, register number data corresponding to register R0 and register number data corresponding to register R1 are respectively supplied to IRGx and IRGy and set into RP1 and RP2. Then, register number data corresponding to R2 is supplied to ORGx and set into RP3. After this, a signal to read the register is supplied to permit the contents of R0 and R1 to be respectively output from the RSEL block 56-R to DBx and DBy.

In this embodiment, a plurality of data buses DBx and DBy are used so that two data can be simultaneously transferred in the above process.

Data output to DBx and DBy are received by two input terminals of the ALU 67. Then, the control unit 66 generates a control signal for addition so as to permit the ALU 67 to effect the adding operation. The result of addition is output to the data bus DBx and supplied to the WSEL unit 56-W. After this, a signal to write the register is generated to permit the operation of writing the data into R2. In this way, each instruction is sequentially executed.

The register numbers can be set into RP1 55-1R, RP2 55-2R, RP3 55-1W and RP4 55-2W when the register pointer is not operated, for example, when the ALU 67 is operated. Thus, the arithmetic operation and the operation of setting the register number into the register pointer can be effected in parallel. Therefore, the processing efficiency can be enhanced by overlapping the instruction currently executed on the succeeding process.

Figure 2:
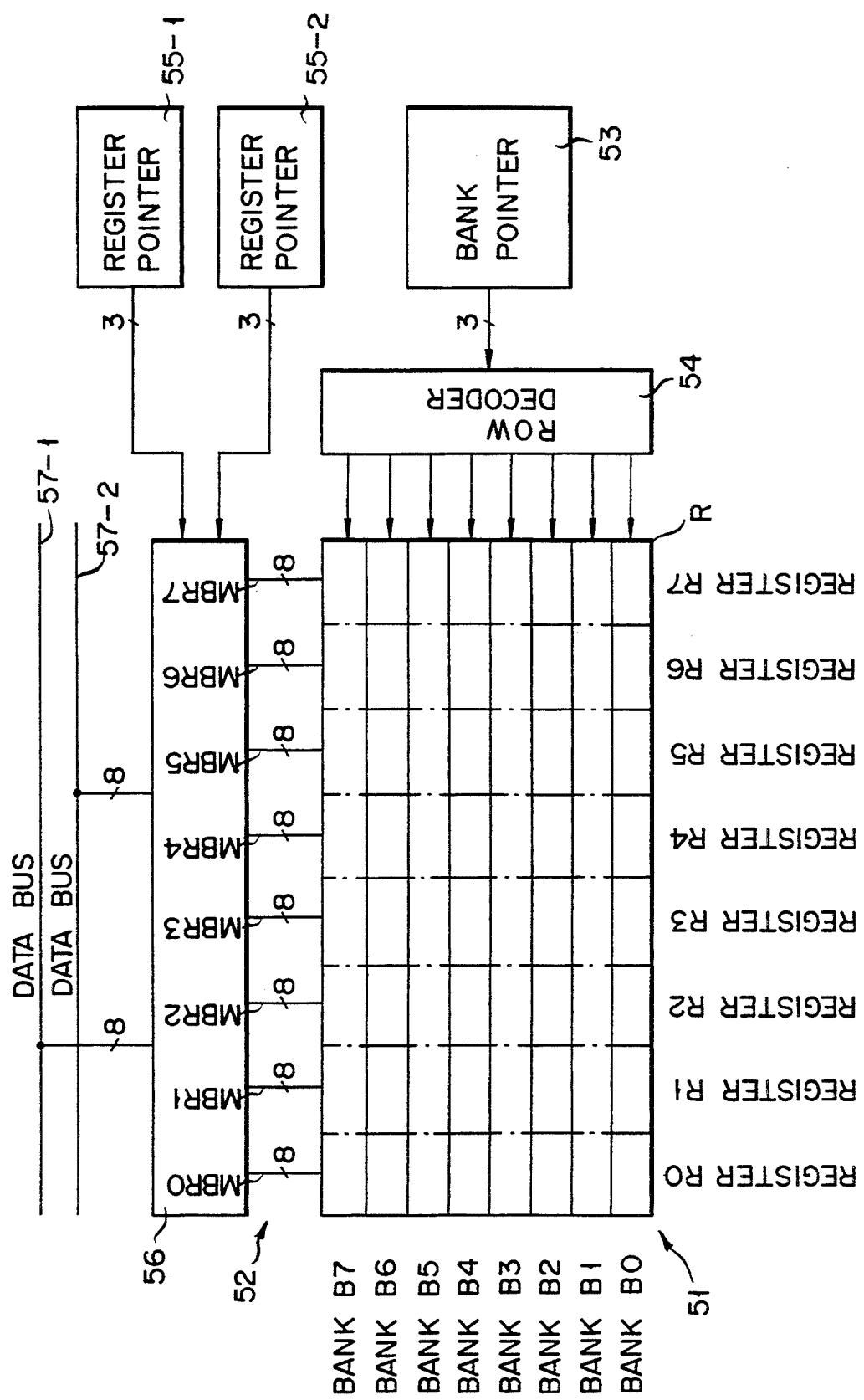
FIG. 2 is a diagram showing the detailed construction of the embodiment shown in FIGS. 1A and 1B.

FIG. 1B is a schematic diagram showing the construction of an embodiment of the register bank circuit of this invention and FIG. 2 is a diagram showing the above construction of an embodiment in more detail. The above construction includes a read/write memory 51 in which each row constitutes a bank formed of a plurality of register blocks and each column is connected to a corresponding one of exclusive memory buses 52, bank number storing means in the form of bank pointer 53 for storing at least one bank number, bank selecting means in the form of ROM decoder 54 for selecting a series of data in response to an output of the bank pointer 53, register number storing means 55 in the form of register pointers 55-1, 55-2 for storing at least one register number, and register selecting means 56 for selecting at least one register from the registers R0-R7 in response to an output of the register pointers 55-1, 55-2. In the read operation, data in all the registers of one bank are output to the memory buses 52. The output data is selected by the register selecting means 56 and then output to at least one of the data lines 57-1, 57-2.

As shown in FIG. 2, the register circuit includes the bank bank pointer 53, the a row decoder 54, the register pointers 55-1 and 55-2, and the register selecting means 56 constituted by a multiplexer. The registers R0-R7 may be one-bit registers or multi-bit registers. In this example, the register bank circuit is so formed that a bank number is 8, a register number in each bank is 8, a register length is 8 bits, and a number of registers which can be simultaneously accessed is 2. Further, in this example, the read/write memory 51, the bank pointer (3 bits) for storing a bank number and the row decoder (8 outputs) for decoding the output of the bank pointer are provided. The memory 51 is divided into 8 banks corresponding to the outputs of the row decoder 54. Each bank of the memory 51 is constituted by a series of registers (R0 to R7) arranged in a row. When a desired bank number (0 to 7) is set into the bank pointer 53, a corresponding output of the bank pointer 53 is input to the row decoder 54. In response to the input from the bank pointer 53, the row decoder 54 decodes the input and activates one of the output signal lines corresponding to the bank number set in the bank pointer 53. As a result, one of the 8 banks of the memory 51 is selected and all the registers (R0 to R7) of the selected bank are connected to the multiplexer 56 via the respective exclusive memory buses 52. At this time, the registers in the bank which is not selected are electrically isolated from the memory buses 52.

In this example, the multiplexer 56 is connected to the register pointer 55-1 (3 bits) for storing a register number and the register pointer 55-2 (3 bits) for independently storing a register number and selects the memory buses 52 according to the outputs of the two register pointers. The memory buses selected by the respective register pointers 55-1 and 55-2 are coupled to the multiplexer 56 via data buses 57-1 and 57-2, respectively. As shown in FIG. 2, the memory buses (MBR0 to MBR7) are set in one-to-one correspondence with the register number and are coupled to data buses 57-1 and 57-2 via the multiplexer 56 so as to permit the reading and writing operations with respect to each register.

More specifically, in the read operation, a bank of registers R0-R7 is selected by the bank pointer 53 and a series of data of the registers R0 to R7 of the selected bank are output to the memory buses 52. Then, this series of data is output to the data buses 57-1 and 57-2 via the multiplexer 56.

In the write operation, a desired number (in this example, 2) of registers are selected by means of the register pointers 55-1 and 55-2 and at least one (in this example, 1) bank is specified by the bank pointer 53 so that data can be written into two registers R in the specified bank.

As described above, in the circuit of this embodiment, if the bank pointer is once set, eight registers of one block in the memory 51 are selected by the row decoder 54 and coupled to the multiplexer via the memory buses. Therefore, the read and write operation with respect to the registers in the selected bank can be effected merely by setting a desired register number into the register pointer. Further, it is possible to simultaneously access two different registers by independently setting register numbers into the register pointers 55-1 and 55-2.

In this example, the bank number is set at 8, the number of registers in the bank is set at 8, the register length is set at 8 bits and the number of registers which can be simultaneously accessed is set at 2. However, the above values are not limitative, and a desired register bank circuit can be constructed by changing the bank pointer length, the number of register pointers and the multiplexer or the like.

Next, the construction of a register bank of this invention is explained by considering a case wherein the register bank 51 of FIG. 1A is constituted by a register model as shown in FIG. 7, for example.

FIG. 7 shows a register model. Each register R is formed with a (n+1)-bits construction of a bit 0 (b0) to a bit n (bn) as a minimum register unit for storing a single datum. (k+1) registers R (e.g.: registers R0 to Rk) constitute a register bank. (m+1) register banks (e.g.: BANK0 to BANKm) constitute a register model.

The register of this invention can be applied as a register which can process data of a desired bit number. Then, a register shown in FIG. 7 is constructed by minimum register units 101 for which each memorize one bit of data. That is, if the register is an 8-bit register, one register is constructed by eight minimum register units 101. A plurality of registers R are combined to constitute one bank.

As shown in FIG. 9, each register of the register bank is arranged so that registers having the same register number may be arranged on the same row.

Further, as shown in FIG. 10, each bit in the register is arranged so that bits of the same register number will be superimposed in the column direction. In this case, each set of a precharging circuit PR and a sense circuit SA is arranged on the same column for each bit column.

Figure 11:
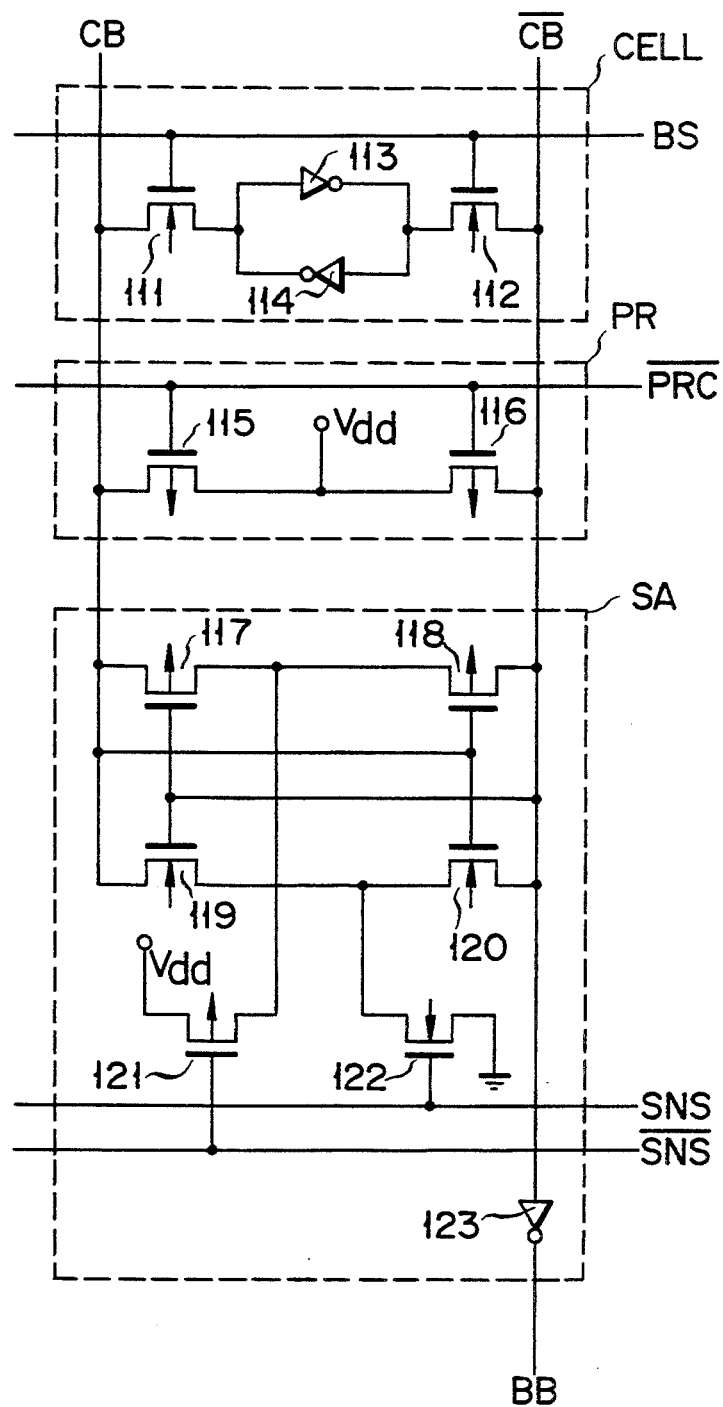
FIG. 11 is a circuit diagram showing one embodiment of a Cell, PR and SA.

FIG. 11 shows a detail circuit construction of one embodiment of a memory cell circuit in which CELL designates a memory cell for storing charges representative of data, PR designates a precharging circuit for supplying a positive potential to bit buses CB and CD and SA designates a sense amplifier for setting the potential of the bit buses. CB and $\overline{CB}$, which is an inverted signal of CB, are bit buses of the cell column. BS is a row selection signal and a cell is selected when the signal BS is at a high level. $\overline{PRC}$ is a control signal for the precharging circuit PR and bit buses CB and $\overline{CB}$ are precharged to a high level when the signal $\overline{PRC}$ is at a low level. SNS and $\overline{SNS}$ are control signals for the sense circuit SA. In the event that the read data is "0", SNS and $\overline{SNS}$ set stably the state of the bit bus CB at the low level and $\overline{CB}$ at the high level when the signals SNS and $\overline{SNS}$ are respectively set at the high and low levels. BB is a reading data signal line for one bit, and the state of the line corresponds to one bit of the reading data. Further, in FIG. 11, Vdd is a power source.

The cell CELL for storing charges as data includes the pair of bit lines CB and $\overline{CB}$, a first FET 111 connected at one end to the bit line CB and having a gate connected to the row selection signal line BS, a first inverter 113 connected at one end to the other end of the first FET 111, a second inverter 114 connected at one end to the other end of the first FET 111, and a second FET 112 connected at one end to the other ends of the first and second inverters 113 and 114 and connected at the other end to the other bit line $\overline{CB}$ and having a gate connected to the row selection signal line BS.

The precharging circuit PR for supplying a potential includes the positive power source Vdd, paired bit lines CB and $\overline{CB}$, a first FET 115 connected at one end to the bit line CB and connected at the other end to the positive power source Vdd and having a gate connected to $\overline{PRC}$, and a second FET 116 connected at one end to the other bit line $\overline{CB}$ and connected at the other end to the positive power source vdd and having a gate connected to $\overline{PRC}$.

The sense amplifier SA for settling the potentials of the bit lines CB and $\overline{CB}$ includes a positive power source vdd, paired bit lines CB and $\overline{CB}$, a first FET 117 connected at one end to the bit line CB, a second FET 118 connected at one end to the other end of the first FET 117 and connected at the other end to the other bit line $\overline{CB}$, a third FET 119 connected at one end to the bit line CB and having a gate connected to the gate of the first FET 117 and the other bit line $\overline{CB}$, a fourth FET 120 connected at one end to the other end of the third FET 119, connected at the other end to the other bit line $\overline{CB}$ and having a gate connected to the gate of the second FET 118 and to the bit line CB, a fifth FET 121 connected between the positive power source Vdd and the other end of the first FET 117 and having a gate connected to receive a control signal $\overline{SNS}$ therefor, and a sixth FET 122 connected between the one end of the FET 120 and a ground terminal and having a gate connected to receive a control signal SNS therefor.

Figure 12:
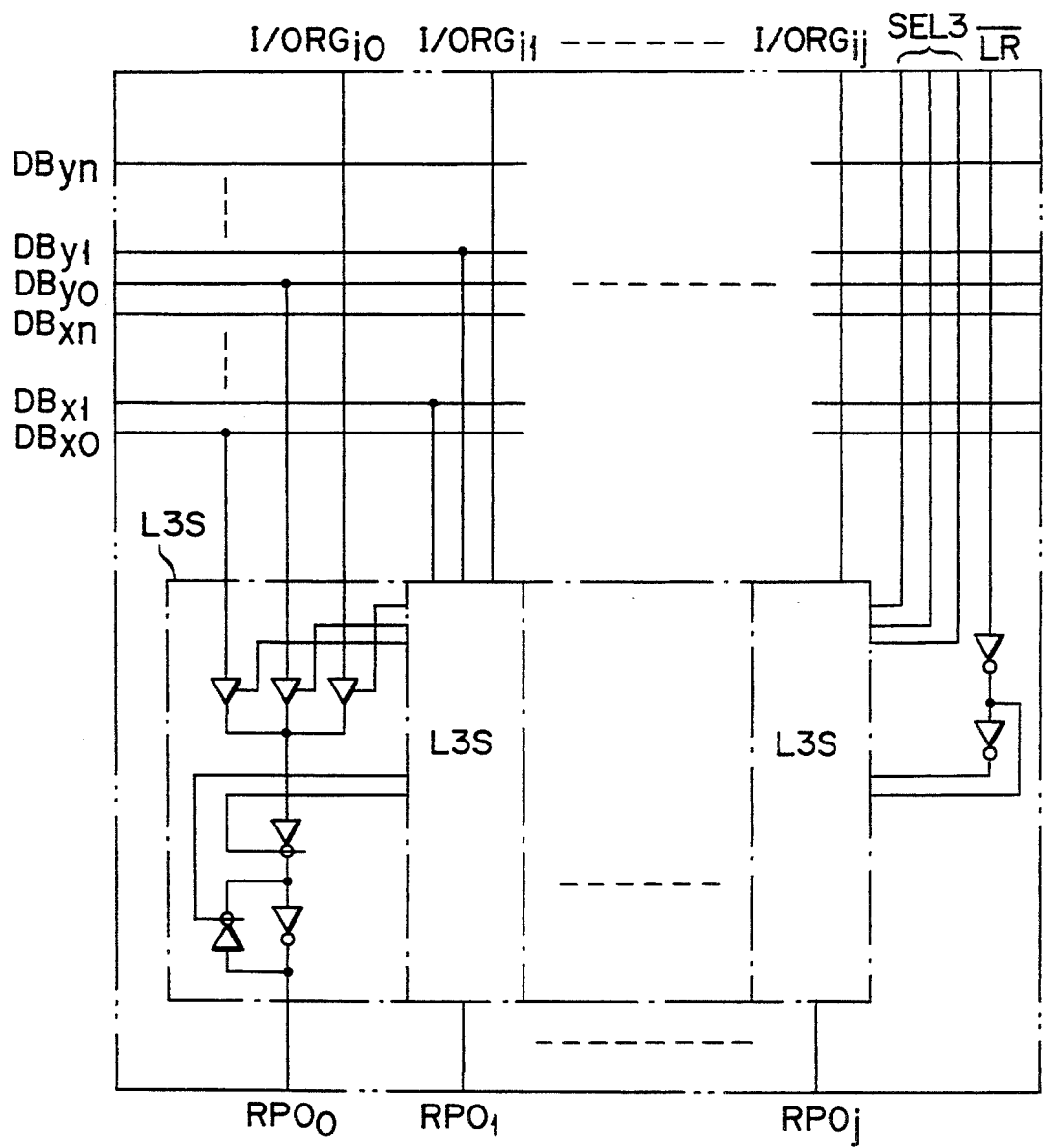
FIG. 12 is a circuit diagram showing one embodiment of the register pointers RP1 to RP4.

FIG. 12 shows the detail circuit construction of the register pointers RP1, RP2, RP3 and RP4. Since, in the example of FIG. 1A, each register pointer has three input terminals of DBx, DBy and one of IRGx or IRGy, ORGx or ORGy, it is constructed by an ordinary latch circuit and a three-input multiplexer connected thereto. That is, circuit blocks L3S corresponding in number to a required bit number are used. For example, if eight registers are provided in each bank, three bits are used, and if 16 registers are provided in each bank, four bits are used. SEL3 in FIG. 12 is a selection signal for specifying one of the three inputs to be selected. An input obtained when the signal is set to the high level is supplied as an input to the register pointer. $\overline{LR}$ is a register number setting signal for the register pointer. When the signal $\overline{LR}$ is set to the low level, input data is received, and when the signal $\overline{LR}$ is set to the high level, the data is stored. DBx0 to DBxn corresponding to input signals shown in FIG. 12 indicate the DBx data bus shown in FIG. 1A, DBy0 to DByn indicate the DBy data bus shown in FIG. 1A, and I/ORGi0 to I/ORGiJ indicate IRGx, IRGy, ORGX and ORGy shown in FIG. 1A. RPO0 to RPOj are outputs of the register pointers and indicate RPO1x, RPO2x, RPO3x and RPO4x shown in FIG. 1A.

FIG. 19 shows the updating operation of the register pointer. In this example, timings from the time when the register number "01" (hexadecimal digit) on IRGx is received until the register selection signals (RS0 to RSk) are varied are shown.

Figure 13:
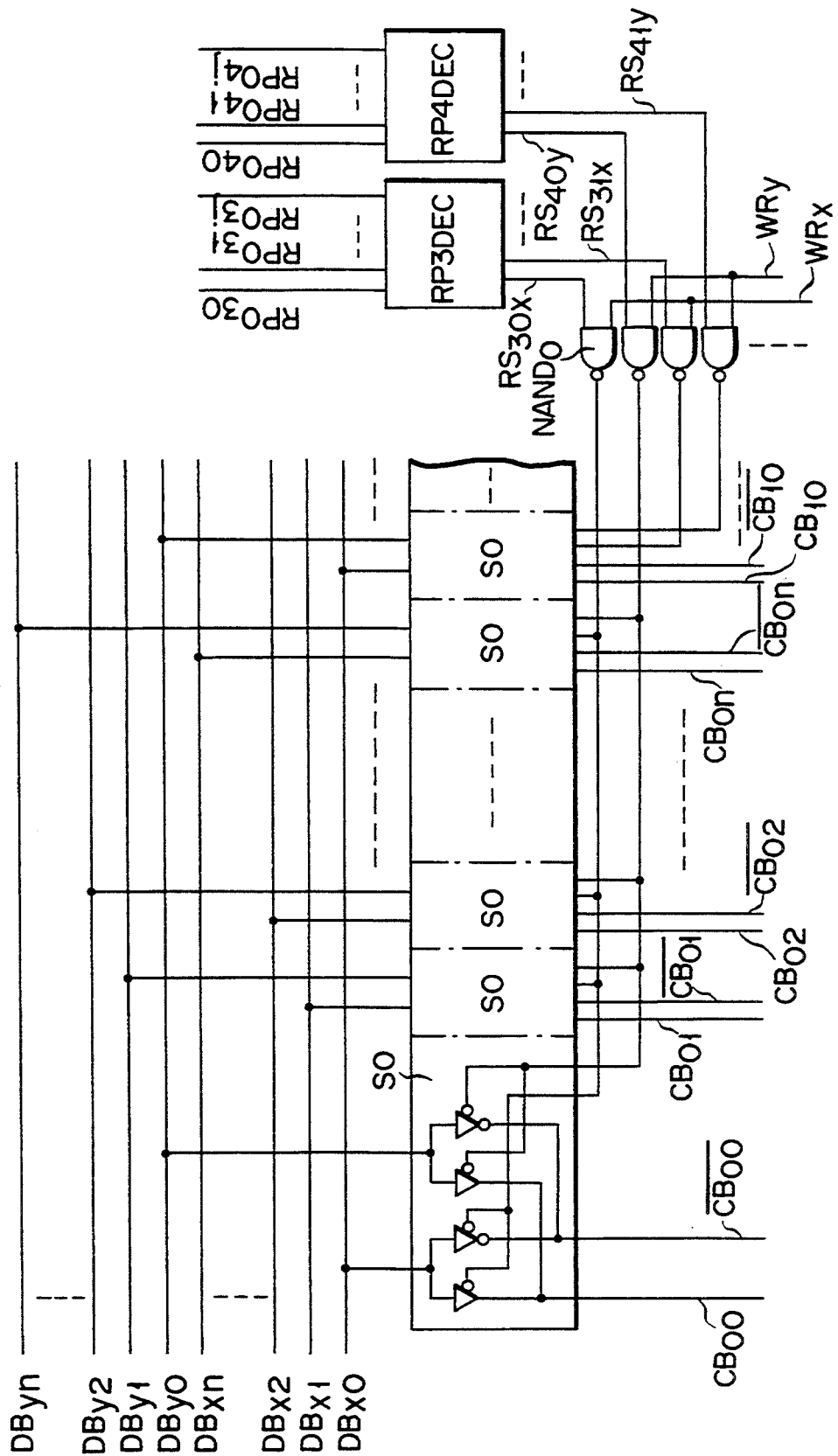
FIG. 13 is a circuit diagram showing one embodiment of a write selector WSEL.

FIG. 13 shows an example of the detail circuit construction of WSEL 56-W of FIG. 1A. In this circuit, outputs RP030 to RPO3j and RPO40 to RPO4J of the register pointers RP3 and RP4 are received and decoded by means of RP3DEC and RP4DEC to create selection signals RS30x, RS31x, RS40y, RS41y,—for the registers into which data is written. In the example of FIG. 1A, two data writing paths are made by means of the data buses DBx and DBy and writing signals WRx and WRy corresponding to the data buses are provided and combined with the register selection signals to create actual writing signals. The writing signals are commonly supplied for each register unit, and data is written into all the bits of one register by one writing signal. SO which is a constituent of the WSEL unit is connected to the data buses DBx and DBy, and whether the data bus DBx or DBy is selected is determined based on the writing signal.

Assuming that data on DBx is written into R0, then the following operation is effected. First, the register number corresponding to R0 is set into the register pointer RP3. The signal RS30x is set to the high level and the other selection signals RS31x,—are set to the low level by decoding the output of RP3 by use of RP3DEC. In this case, when the write-in signal WRx on the DBx side is set to the high level, only the output of NAND0 is set to the low level. Then, a buffer on the DBx side of the SO block corresponding to R0 which is connected to the output of NAND0 is made active, and data on DBx is supplied to bit buses CB00, CB01,—, and CB0n corresponding to the respective bits and inverted signals of the data are supplied to the bit buses $\overline{CB00}$, $\overline{CB01}$,—, and $\overline{CB0n}$. At this time, no influence is given to the bit buses corresponding to the other register numbers. In the cell portion, the cell selection signals BS of one row corresponding to any one of the register banks are set at the high level and the precharging circuits PR and sense circuits SA are set in the nonactive state. Since, in this condition, data of DBx is forcedly supplied to the bit buses corresponding to the bits of R0, data on the bit buses will be written into the cells of bits corresponding to R0 in the selected cell. However, since the states of the bit buses are not changed in the other cells, no variation occurs. When time required for data write-in has elapsed, the WRx signal is set to the low level, SO corresponding to R0 of WSEL which has supplied data on DBx to the bit bus is made nonactive. The bit bus corresponding to R0 holds written data and is set into a state as if the data reading operation is effected.

Thus, the operation of writing data into the register is effected. Therefore, unlike the case wherein an ordinary RAM is used, it is not necessary to effect the operation of setting the decoder according to the writing address and the precharging operation. Further, it is not necessary to effect a special operation for a re-reading request after the writing operation.

FIG. 21 shows timings at which data "55" (hexadecimal digit) on DBx and data "AA" (hexadecimal digit) on DBy are simultaneously written into R0 and R1, respectively.

FIG. 14 shows an example of the detail circuit of RSEL 56-R in FIG. 1A. Register selection signals RS10x, RS11x, RS20y, RS21y,—are created by means of RP1DEC and RP2DEC which receive outputs RPO10 to RPO1j and RPO20 to RPO2j from the register pointers RP1 and RP2. In the example of FIG. 1A, two reading data paths DBx and DBy are provided, a reading signal RDx on the DBx side and a reading signal RDy on the DBy side corresponding to the two data paths are combined to create an actual reading signal for the selection register. The reading signal is commonly supplied for each register unit and all the bits of one register are read by one reading signal. SI which is a constituent element of the RSEL unit is connected to reading data signal lines BB00, BB01,—of each register as input lines to selectively supply outputs to the data buses DBx and DBy. In the above reading operation, all the data of registers in selected bank is read and continuously supplied to RSEL as input to SI. Therefore, data can be instantaneously output to a desired data bus DBx or DBy from the selector circuit SI by setting a register number corresponding to a register from which data is read and applying a reading signal thereto.

Thus, with the register of this invention, the access time is required only when the register bank is changed and the access time in this operation is as short as negligible.

FIG. 20 shows an example of timings at which the contents of the registers R0 and R1 are simultaneously read and supplied to DBx and DBy.

A register which requires high speed operation and re-reading operation after the write-in operation can be realized in a simple construction by use of the above circuit construction.

Figure 15:
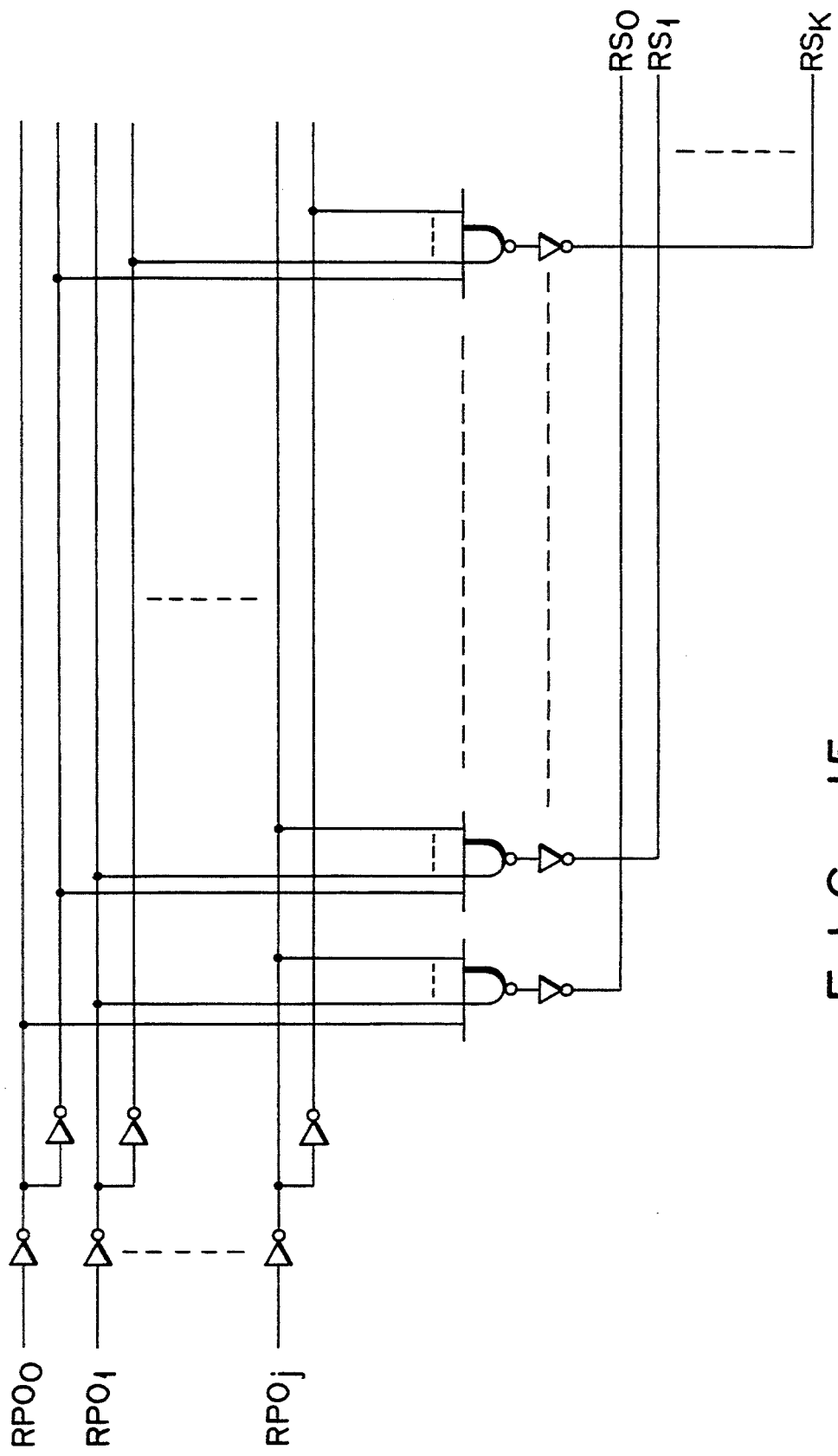
FIG. 15 is a circuit diagram showing one embodiment of RP1DEC, RP2DEC, RP3DEC and RP4DEC.

FIG. 15 shows an example of the circuit construction of RP1DEC, RP2DEC, RP3DEC and RP4DEC for creating a register selection signal based on the output of the register pointer. It is constructed by eight NAND-NOT circuits in a case where a 3-bit register pointer is used, and by 16 NAND-NOT circuits in a case where a 4-bit register pointer is used.

FIG. 16 shows an example of the circuit construction of the bank pointer BP. In the example of FIG. 1A, the bank pointer has two inputs of DBx and DBy and therefore the two-input multiplexer is provided in the input stage of an ordinary latch circuit. The selection signal for the multiplexer is SEL2. The latch signal of the bank pointer is $\overline{LB}$, and data on DBx or DBy is input via the multiplexer when $\overline{LB}$ is set at the low level, and the data is held when it is set at the high level. BPO0 to BPO1 are output signals of the bank pointer and indicate BPOx shown in FIG. 1A. In a case where the number of banks is 8, the bank pointer is formed with a 3-bit construction, and when the number of banks is 16, the bank pointer is formed with a 4-bit construction.

Figure 17:
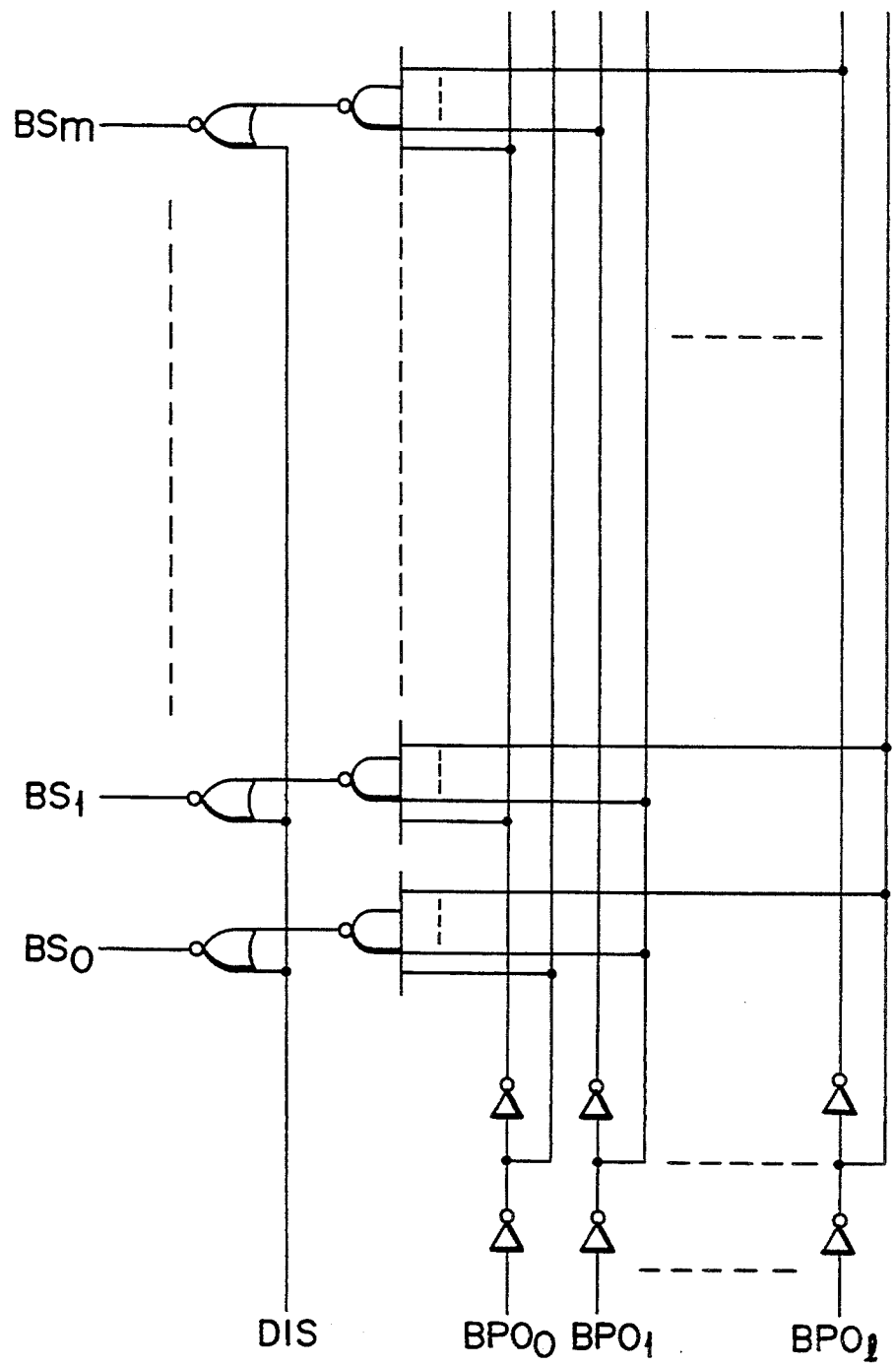
FIG. 17 is a circuit diagram showing one embodiment of a decoder DEC.

FIG. 17 shows an example of the detailed circuit construction of the decoder DEC 54 in FIG. 1A. For creating bank selection signals (BS0 to BSm) in response to output signals BPO0 to BPO1 from the bank pointer BP. The bank selection signals are combined with the row selection signal BS of the bank register 51 so as to permit the bank pointer to select one row of cells in the register bank 51.

The bank selection signals are unstable while the content of the bank pointer is being changed, and therefore a DIS signal line is used to transmit a bank selection inhibiting signal for keeping the selection signals in the nonactive state while the content of the bank pointer is being changed.

FIG. 18 shows timings at which the register banks are changed. In this example, timings from the time when data "01" (hexadecimal) on the DBx data bus is received and the register bank 1 is selected until all the data bits of all the registers in the register bank 1 are read are shown.

When the data latch signal $\overline{LB}$ to the bank pointer is made active, the DIS signal is made active to inhibit supply of the bank selection signal. At this time, a $\overline{PRC}$ pulse signal is generated in order to precharge the bit buses in the register bank in the bank selection inhibiting period. This is necessary to prevent data in the cells of the register bank 51 which is newly selected from being destroyed. When the latch signal $\overline{LB}$ is made nonactive, the bank selection inhibiting signal DIS is also made nonactive and only the selection signal BS1 for the register bank 1 is set to the high level. As a result, one row of cells corresponding to the register bank 51 is selected and the bit buses connected to the selected cells are driven by the cell data. Then, in order to operate the sense circuit SA, the SNS and $\overline{SNS}$ pulse signals are applied. When the sense circuit SA is operated, data on the bit buses in the register bank 51 are stably set into the respective states.

Thus, data of all the bits of all the registers in the selected register bank are read out and supplied to the RSEL circuit via the readout data signal line BB. The precharging circuit PR and the sense circuit SA are operated when the register bank is changed and are kept nonoperative when data is read out from or written into the register.

As is clearly understood from the explanation for the applications of this invention, since data can be accessed without an addressing operation which is required in a case where an ordinary RAM is used, the high-speed accessing operation can be attained as in the case of using the register latch. Thus, a register bank circuit in this invention which has a large capacity can be easily formed with a small circuit scale at a low cost.

Figure 3:
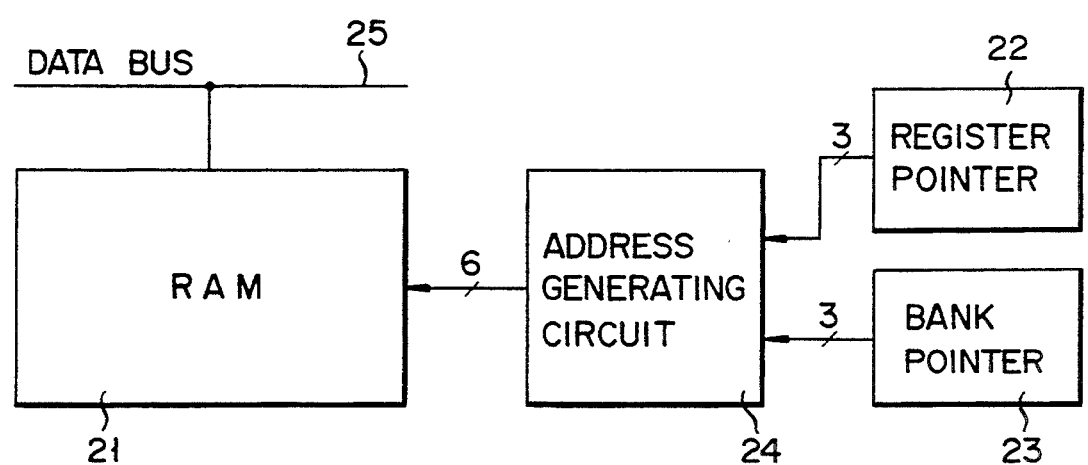
FIGS. 3 to 6 are circuit diagrams of the conventional register bank circuit.

In the conventional system of FIG. 3, a RAM is used as a register and an address is created based on the bank number and register number to access the register. Therefore, even when the register in the same bank is accessed, it is necessary to newly provide the address each time the register is accessed. Theoretically, only one register can be accessed in each accessing operation.

In contrast, in this invention, all the registers of one bank can be selected by the decoded signal of the bank number, and therefore it is only necessary to change the output state of the register selection means such as the multiplexer by the register number when a different register in the same bank is accessed. Further, a plurality of register numbers can be specified by using a plurality of multiplexers so that a plurality of registers can be simultaneously accessed. As a result, the access time for each access to the register can be made unnecessary and the access time is required only when the bank is changed, making it possible to attain high speed accessing operation.

Figure 4:
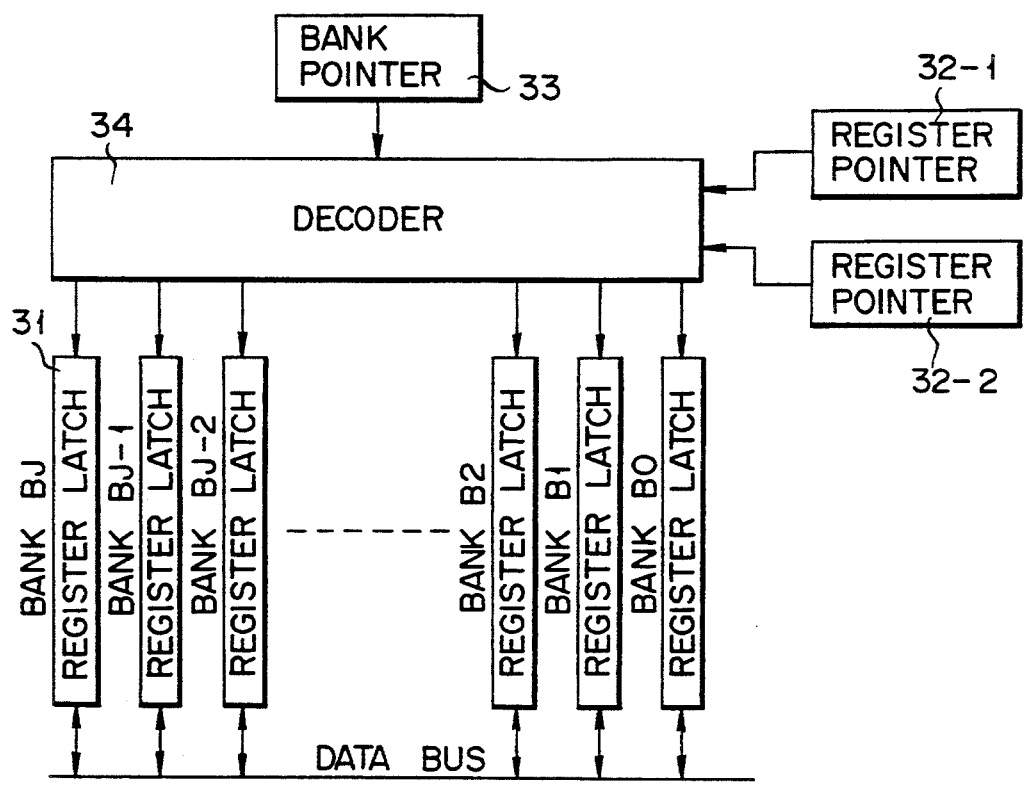
Figure 5:
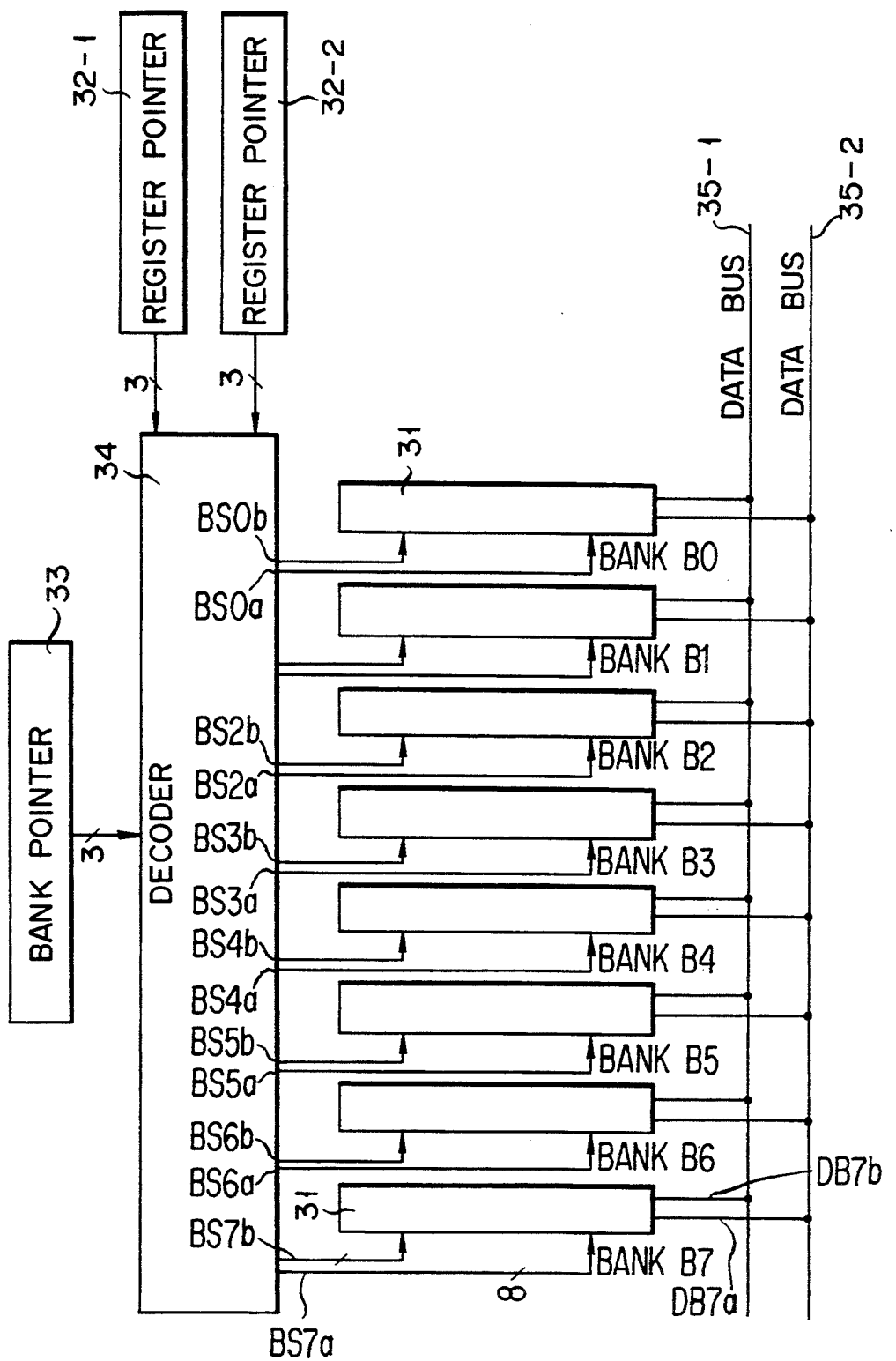
Figure 6:
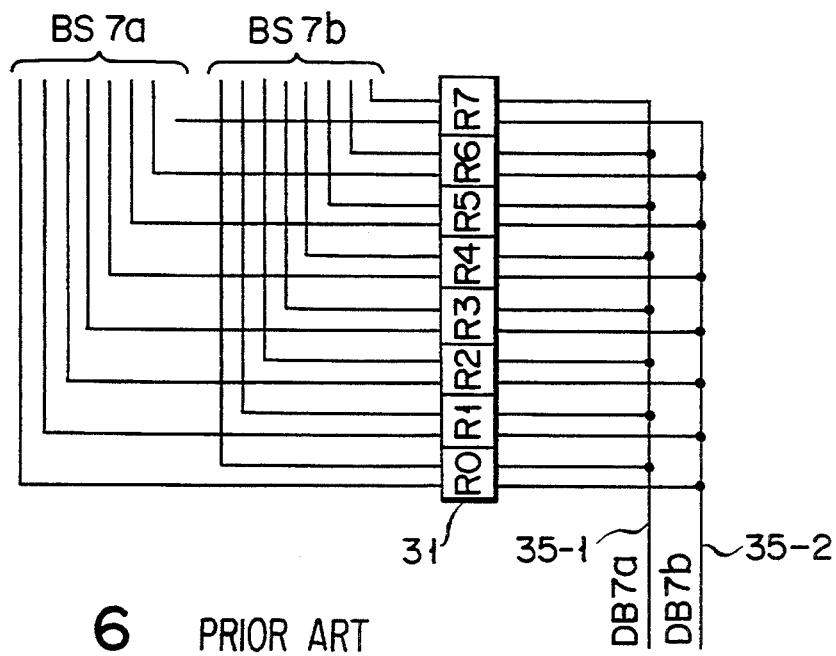

Further, in the conventional system of FIGS. 4 to 6, since the register is constructed by the register latch, the circuit scale becomes large and the number of output lines of the decoder becomes large. Therefore, when it is formed in an integrated configuration, the area thereof becomes extremely large. Further, when the numbers of registers and banks are changed, it becomes necessary to modify the design for the decoder with a large circuit scale, thus providing little flexibility.

In contrast, in this invention, the decoder and multiplexer which can be formed with a small circuit scale can be used in association with the registers. Further, when the numbers of the registers and banks are changed, it is only necessary to change the numbers of the decoders and memories with a small circuit scale, thus providing a sufficiently large flexibility.

As described above, according to this invention, a register bank circuit which is sufficiently flexible in regard to circuit scale, operation speed and the number of registers can be easily realized at a low cost. In particular, when the register bank circuit is incorporated into a microprocessor or integrated circuit, the occupancy rate on the chip area can be minimized, the system capability thereof can be fully utilized and the optimum cost/performance can be obtained.

What is claimed is:

1. A register block circuit for a central processing unit of a microprocessor, comprising:

bus means for transferring data;

register array means for storing the data, the register array means having a matrix structure which is formed by a plurality of banks arranged in a row and a plurality of registers arranged in a column, each of the plurality of banks being a group of a predetermined number of registers, the row of the matrix structure being divided based on bank numbers, the column of the matrix structure being divided based on register numbers, and one of the plurality of registers contained in the register array means being identified by designating one of the bank numbers and one of the register numbers;

bank number means, connected to the bus means, for storing a bank number corresponding to a respective one of the plurality of banks;

bank selector means, connected between the register array means and the bank number means, for selecting a respective one of the plurality of banks that is identified by a bank number supplied from the bank number means;

first means, connected to the bus means, for storing a register number corresponding to a respective one of the plurality of registers, so as to designate a register in the register array means in which data is to be written;

second means, connected to the register array means, the first means, and the bus means, for selecting a first one of the plurality of registers to write data therein, the first selected register being identified by register number in the first means and being coupled to the bus means;

third means, connected to the bus means, for storing a register number corresponding to a respective one of the plurality of registers so as to designate a register in the register array means from which data is to be read; and fourth means, connected to the register array means, the second means, and the bus means, for selecting a second one of the plurality of registers to read data therefrom, the second selected register being identified by the register number stored in the third means and being coupled to the bus means, the register array means permitting both data writing and data reading to be executed simultaneously with respect to different registers contained in a same bank of the plurality of banks.

2. A register bank circuit according to claim 1, wherein said data bus means includes a plurality of data buses.

3. A register bank circuit according to claim 1, wherein said means for storing the register number includes a plurality of register number storing units.

4. A register bank circuit according to claim 1, wherein said register array means for storing data is constructed by a one bit register means for storing one bit data; and said minimum register means comprises means for charging electrons connected to bit lines; means for charging said bit lines coupled to said bit lines; and means, connected to said bit lines, for settling potential of bit lines.

5. A central processing unit of a microcomputer system, comprising:

arithmetic means for processing data;

bus means, coupled to said arithmetic means, for transferring data;

register array means for storing data, the register array means having a matrix structure which is formed by a plurality of banks arranged in a row and a plurality of registers arranged in a column, each of the plurality of banks being a group of a predetermined number of registers, the row of the matrix structure being divided based on bank numbers, the column of the matrix structure being divided based on register numbers, and one of the plurality of registers contained in the register array means being identified by designating one of the bank numbers and one of the register numbers;

bank selector means, connected between the register array means and the bank number means, for selecting one of the plurality of banks that is identified by the bank number stored in the bank number means;

first means, connected to the bus means, for storing a register number supplied from the arithmetic means, so as to designate a register in the register array means in which data is to be written;

second means, connected to the register array means, the first means, and the bus means, for selecting a first one of the registers to write data therein, the first selected register being identified by the register number stored in the first means and being coupled to the bus means;

third means, connected to the bus means, for storing a register number supplied form the arithmetic means, so as to designate a register in the register array means from which data is to be read; and fourth means, connected to the register array means, the second means, and the bus line, for selecting a second one of the registers to read data therefrom, the second selected register being identified by the register number stored in the third means and being coupled to the bus means, the register array means permitting both data writing and data reading to be executed simultaneously with respect to different registers contained in a same bank of the plurality of banks.

6. A microprocessor according to claim 5, wherein said means for selecting the register number register comprises a reading means used for the reading operation and a writing means used for the writing operation.

7. A register block circuit for a central processing unit of a microprocessor, comprising:

bus means for transferring data;

register array means for storing the data, the register array means having a matrix structure which is formed by a plurality of banks arranged in a row and a plurality of registers arranged in a column, each of the plurality of banks being a group of a predetermined number of registers, the row of the matrix structure being divided based on register numbers, and one of the plurality of registers contained in the register array means being identified by designating one of the bank numbers and one of the register numbers;

bank number means, connected to the bus means, for storing a bank number corresponding to a respective one of the plurality of banks;

bank selector means, connected between the register array means and the bank number means, for selecting a respective one of the plurality of banks that is identified by a bank number supplied from the bank number means;

a plurality of first register pointers, connected to the bus means, for storing a register number corresponding to a respective one of the plurality of registers, so as to designate a register in the register array means in which data is to be written, and for selecting some of the plurality of registers to write data therein, the registers selected by the first register pointers being identified by register numbers in the first register pointers and being coupled to the bus means; and a plurality of second register pointers, connected to the bus means, for storing a register number corresponding to a respective one of the plurality of registers so as to designate a register in the register array means from which data is to be read, and for selecting some of the plurality of registers to read data therefrom, the registers selected by the second register pointers being identified by register numbers stored in the second register pointers, and being coupled to the bus means, the register array means permitting both data writing and data reading to be executed simultaneously with respect to different registers contained in a same bank of the plurality of banks.

* * * * *